United States Patent [19]
Nakanishi

[11] Patent Number: 5,504,273
[45] Date of Patent: Apr. 2, 1996

[54] FIXING MEANS FOR FLAT CIRCUIT UNITS AND THE FLAT CIRCUIT UNITS USED THEREFOR

[75] Inventor: Ryuji Nakanishi, Yokkaichi, Japan

[73] Assignee: Sumitomo Wiring Systems, Ltd., Japan

[21] Appl. No.: 328,040

[22] Filed: Oct. 24, 1994

[30] Foreign Application Priority Data

Oct. 25, 1993 [JP] Japan ................................. 5-289916

[51] Int. Cl.$^6$ ................................................. H01B 11/02
[52] U.S. Cl. ..................... 174/34; 29/829; 156/47; 174/117 FF; 333/238
[58] Field of Search ........................ 174/32, 33, 34, 174/117 R, 117 FF; 333/238, 246; 29/829; 156/47

[56] References Cited

U.S. PATENT DOCUMENTS

| | | |
|---|---|---|
| 244,167 | 7/1881 | Ball . |
| 2,963,535 | 12/1960 | Wegener et al. .................... 333/238 |
| 3,647,932 | 3/1972 | Heller et al. ........................ 174/34 |
| 3,757,028 | 9/1973 | Schlessel .......................... 174/33 |
| 3,761,842 | 9/1973 | Gandrud ........................... 333/1 |
| 3,764,727 | 10/1973 | Balde ................................ 174/34 |
| 5,214,244 | 5/1993 | Cummings et al. .................. 174/42 |
| 5,262,740 | 11/1993 | Willems ............................. 333/26 |

FOREIGN PATENT DOCUMENTS

| | | |
|---|---|---|
| 348954 | 1/1990 | European Pat. Off. . |
| 120928 | 5/1993 | Japan . |
| 61752 | 7/1993 | Japan . |

*Primary Examiner*—Morris H. Nimmo
*Attorney, Agent, or Firm*—Jordan B. Bierman; Bierman and Muserlian

[57] ABSTRACT

In an electrical wiring system, a typical process for suppressing noise due to electric current consists in preparing a pair of flat circuit units comprising respectively an insulation layer and at least one circuit conductor therein or thereon which undulates to form wave-like patterns and in superposing fixedly said conductor of the first unit with that of the second unit in such that at least one insulation layer is interposed between the superposed conductors and whereby peaks of the second unit conductor face troughs of the first unit conductor; according to the invention, fixing is performed by means enabling to interweave said peaks with said troughs. One such means consists in providing the first flat circuit unit with trough-side slits and the second with peak-side slits and in inserting the tongues formed by the trough-side slits in the peak-side slits. Another such means consists in forming a pair of flat circuit units and corresponding circuit conductors into an undulation and in interweaving the pair in alternate upside and downside fashion.

18 Claims, 3 Drawing Sheets

FIXING MEANS FOR FLAT CIRCUIT UNITS AND THE FLAT CIRCUIT UNITS USED THEREFOR

The present invention relates to fixing means for flat circuit units for wiring networks in a system of flat circuit units, such as flat cables or the like, which are used for wiring inside a car or an electronic appliance or the like, as well as to the flat circuit units used for this purpose.

BACKGROUND OF THE INVENTION

In case of wiring inside a car or an electronic appliance and the like, the wiring includes not only signal wires used for the digital signals which operate internal logic circuits or for the input/output signals which interface with outside appliances or the like, but also electrical source wires or ground wires which provide power for the electronic appliance with electric power. For this reason, magnetic fluxes are generated by a large amount of electric current passing through the electric source wire, thus producing noise on the digital signals, etc. Various measures have been taken to prevent such noise.

As an example, JP-A-H5 120 928 (1993) discloses a system of structures adopted as a measure when the flat circuit units are used for the wiring inside a car. According to this system, as is shown in FIG. 6, a pair of flat circuit units 5, 6, each presenting flat conductors 3, 4 are superposed fixedly. The flat conductors 3, 4 undulate to form wave-like patterns on insulation respective films 1, 2. In this way, when viewed from the direction perpendicular to the planes of the flat circuit units 5, 6, areas bounded by respective upper or lower flat conductors 3, 4 are formed between pairs of points where the two flat conductors 3, 4 intersect. This configuration makes it possible to suppress the formation of noise.

The upper and lower elements that constitute the aforementioned flat circuit units 5, 6 provided with the undulating flat conductors 3, 4 are disclosed as being fixed in superposition by means of adhesives 7, or by heat deposit adhesion without using the latter adhesives or again by a fold-back method.

However, with these fixing means, a dislocation tends to appear during fixing between the respective positions of the conductors 3, 4 undulating to form wave-like patterns. This phenomenon is a disadvantage in that it interferes with reliable production.

In view of these problems, an object of the present invention is to prevent the formation of dislocations between the respective positions of the flat circuit units and to provide means for fixing the flat circuit units which can be implemented in a stable manner. Another object of the invention is to provide flat circuit units in which such means are implemented.

SUMMARY OF THE INVENTION

These objects are attained by a process for fixing a pair of flat circuit units comprising the steps of:

preparing a pair of flat circuit units, each unit comprising an insulation layer and at least one circuit conductor therein or thereon, usually flat but not limited to this form, said circuit conductor undulating along the plane direction of said insulation layer and extending in its longitudinal direction, so as to form wave-like patterns along the plane, superposing fixedly said flat circuit units in a coplanar fashion, such that at least one insulation layer is interposed between the superposed conductors, and whereby each peak of one of undulating circuit conductor faces each trough of the other undulating circuit conductor and such that areas delimited by the respective circuit conductors are formed between pairs of points where said circuit conductors intersect each other, characterised in that the pair of flat circuit units are fixed by interweaving the peaks of the wave-like pattern of one of said undulating circuit conductors with corresponding troughs of the wave-like pattern of the other undulating circuit conductor, or vice versa.

According to one of the preferred embodiments of the invention, the interweaving process involves forming two circuit conductors in each of the flat circuit units; providing, for a first circuit unit, a plurality of peak-side slits, preferably at regular intervals, through the insulation layer at positions inside and along the peaks of the two circuit conductors of said first circuit unit as viewed from the longitudinal centre axis, and, for a second circuit unit, a plurality of trough-side slits through the insulation layer at positions, inside and along the troughs of the two circuit conductors, of said second circuit unit as viewed from said axis, the positions of said trough-side slits corresponding to those of said peak-side slits of said first circuit unit; and inserting each tongue formed by each trough-side slit of said second circuit unit in each peak-side slit of said first circuit unit.

Each slit is configured as a cut portion contoured so that it can be folded back to form a tongue or tub portion.

In this embodiment, the two circuit conductors are provided preferably in the vicinity of each of the longitudinal edges of the flat circuit unit.

As one variant of such embodiment, slits may be provided for every trough-side of one of the flat circuit units and for every peak-side of the other flat circuit unit, or vice versa, as viewed from the longitudinal centre axis of said units.

As another variant, at least one of either the peak-side slits or the trough-side slits may be provided, at both extremities of the slits, with perforations to prevent tearing.

Thus, the slits or cut portions are terminated at their respective ends by perforations in the insulation layer, for example, round and small perforations or holes.

Also, each of the flat circuit units may comprise one or more linear circuit conductors.

Another preferred embodiment of such technical means consists in a process wherein the means enabling interweaving is prepared by forming the insulation layers of both of the flat circuit units as an undulation to form wave-like patterns, in correspondence with those of their respective circuit conductors, the breadth of the wave-like patterns being a little wider than that of the corresponding circuit conductor; and fixing the pair of flat circuit units reciprocally by interweaving the peaks of one unit with corresponding troughs of the other unit, or vice versa, in alternate upside and downside fashion. Such interweaving is formed preferably at every intersection of both units but may also be formed at any other appropriate interval.

For any of the aforementioned embodiments or their variant, the flat circuit unit may be a flat cable, whilst the insulation layer may be an insulation film.

Also, the exposed circuit conductor side of the units may be covered with another insulation layer, preceding to, or after interweaving. Furthermore, the circuit conductor may be a plurality of conductors so assembled as to form a single conductor composition.

According to another object of the present invention, such technical means were made possible by specifically designing a pair of connected flat circuit units, each unit comprising an insulation layer and at least one circuit conductor therein or thereon, usually flat but not limited to this form, said circuit conductor undulating along the plane direction of said insulation layer and extending in its longitudinal direction so as to form wave-like patterns along the plane, wherein said flat circuit units are superposed fixedly in a coplanar fashion, in such a way that at least one insulation layer is interposed between the superposed conductors, whereby each peak of one of the undulating circuit conductor faces each trough of the other undulating circuit conductor and so that areas encircled by the respective circuit conductors are formed between the two points where said circuit conductors intersect each other, characterised in that the pair of flat circuit units are fixed by interweaving means enabling to interweave peaks of the wave-like patterns of one of said undulating circuit conductors with corresponding troughs of the wave-like patterns of the other undulating circuit conductor, or vice versa.

The interweaving in each of the flat circuit units may be formed by two circuit conductors; and, for the first circuit unit, a plurality of peak-side slits may be formed, preferably at regular intervals, through the insulation layer at positions inside and along the peaks of the two circuit conductors of said first circuit units as viewed from the longitudinal centre axis; and, for the second circuit unit, a plurality of trough-side slits are formed through the insulation layer at positions inside and along the troughs of the two circuit conductors of said second circuit unit as viewed from said axis, the positions of said trough-side slits corresponding to those of said peak-side slits of said first circuit unit, and each tongue formed by each trough-side slit of said second circuit unit being inserted in each peak-side slit of said first circuit unit.

The slits may be provided for every trough-side of said second flat circuit unit and for every peak-side of said first flat circuit unit or vice versa, as viewed from the longitudinal centre axis of said units.

Furthermore, at least either the peak-side slits or the trough-side slits may be provided, at both extremities of the slits, with perforations to prevent tearing.

Also, each of the flat circuit units may comprise one or more linear circuit conductors.

As another interweaving means, both of the flat circuit units may comprise the insulation layers being respectively made into an undulation to form wave-like patterns in accordance with those of their corresponding circuit conductor, the breadth of the wave-like patterns of the insulation layers being a little larger than that of the corresponding circuit conductor; the pair of flat circuit units being fixed reciprocally by interweaving the peaks of one unit with the troughs of the other unit, or vice versa, in alternate upside and downside fashion.

Such interweaving is formed preferably at every intersection of the two units, but may also be formed at any other appropriate interval.

For any such means, the flat circuit unit may be a flat cable and the insulation layer may be an insulation film.

Also, the exposed circuit conductor side of the units may be covered with another insulation layer, preceding to, or after interweaving. Furthermore, a circuit conductor may be a plurality of conductors so assembled as to form a single conductor composition.

The process and the pair of connected flat circuit units specifically designed therefor according to the present invention solve effectively the problems observed in the prior art, in that dislocations which tend to appear during fixing between the respective positions of the circuit conductors undulating to form wave-like patterns are suppressed. Fixing can thus be carried out reliably, ensuring in consequence a stable yield of the flat circuit units.

Furthermore, the subject of the present invention has the advantage of necessitating no other fixing material.

BRIEF DESCRIPTION OF THE DRAWINGS

The above and other objects, features and advantages of the invention will be apparent from the following description of the preferred embodiments, given as a non-limiting example, with reference to the accompanying drawings, in which.

DETAILED DESCRIPTION OF THE PREFERRED EMBODIMENTS

Figure 1:
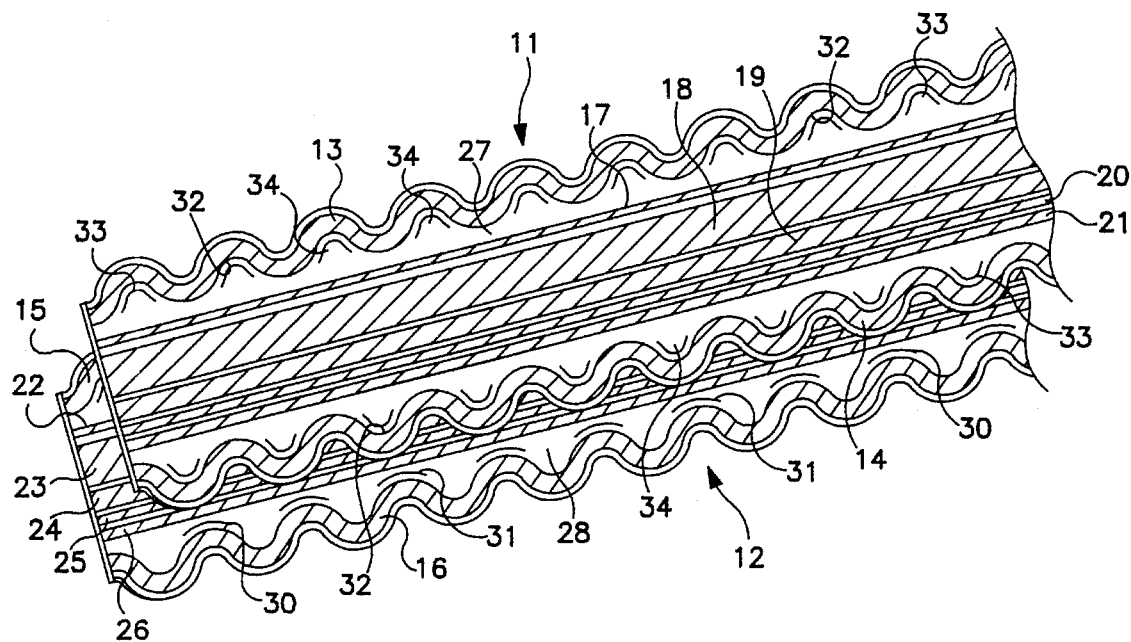
FIG. 1 is an exploded perspective view, showing the first embodiment of the invention.
Figure 2:
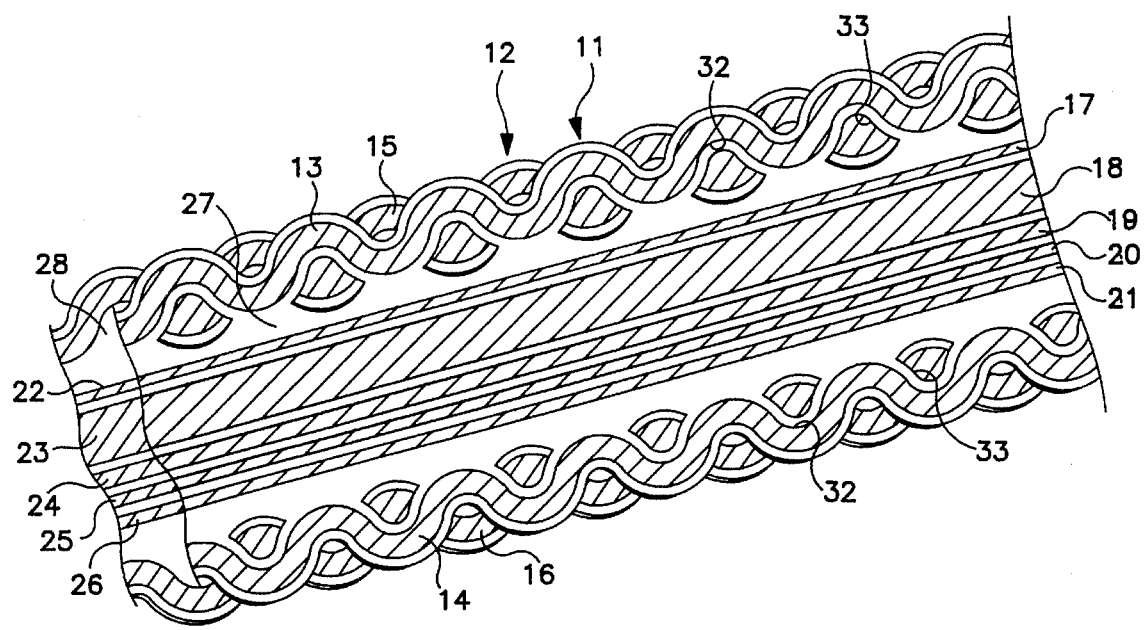
FIG. 2 is a perspective view, showing the fixed state of the same.

In FIG. 1 and FIG. 2, references 11, 12 show a pair of flat cables as an example of flat circuit units. Each flat cable 11, 12 is provided, along its longitudinal direction and in the vicinity of each of its longitudinal edges with flat conductors 13, 14, 15, 16 respectively, as an example of circuit conductors undulating to form wave-like patterns. In addition, between the flat conductors 13 to 16 on both sides thereof, linear flat conductors 17 through 26 are respectively provided along the longitudinal direction.

In this example, though not shown in the figures, each flat side of the flat conductor 13 to 26 is coated with an insulation layer 27, 28 such as an insulation film or similar so that said flat conductor is embedded in said insulation layer. Both of the longitudinal edges of the insulation layers 27, 28 of each flat cable 11, 12 are made into corresponding wave-like forms along the flat conductors 13, 14, 15, 16 which are undulating to form wave-like patterns.

In the flat cable 12 positioned on the down side, the latter comprising each of the undulating flat conductors 15, 16, peak-side slits 31 are provided along each peak 30, and outside the protruding direction of each peak 30 which is protruding inwardly in the transversal direction of the flat cable 12, that is, the peak-side slits are provided towards the inside of the peaks in the transversal direction of the flat cable 12.

In the flat cable 11 positioned on the up side, the latter comprising each of the undulating flat conductors 13, 14, trough-side slits 33 are provided along each trough 32 and inside the recess provided therein, said recesses facing inwards in the transversal direction of the flat cable 11, that is, the trough-side slits are provided towards the inside of the troughs in the transversal direction of the flat cable 11. Each tongue 34 is formed respectively by each trough-side slit 33.

Then, the two flat cables 11 and 12 are superposed and each tongue 34 of the upper flat cable 11 is inserted into the position of each peak-side slit 31 of the lower flat cable 12. When seen from the perpendicular direction with respect to the planes of both of the flat cables 11, 12, as shown in FIG. 2, the two flat cables are reciprocally fixed by forming areas encircled by each of the respective flat conductors 13, 15 and 14, 16 between the two points where the undulating flat conductors 13, 15 intersect, as do conductors 14, 16.

Because each tongue 34 formed by each trough-side slit 33 of one of the flat cables 11 is inserted into each peak-side slit 31 of the flat cable 12, dislocations between the respective positions of the flat cable 11, 12 are effectively prevented and the flat cables can be fixed reliably. This fixing means uses insulation layers 27, 28 such as insulation films or the like which constitute the flat cables 11, 12 and have the advantage that no other fixing material is needed.

Figure 3:
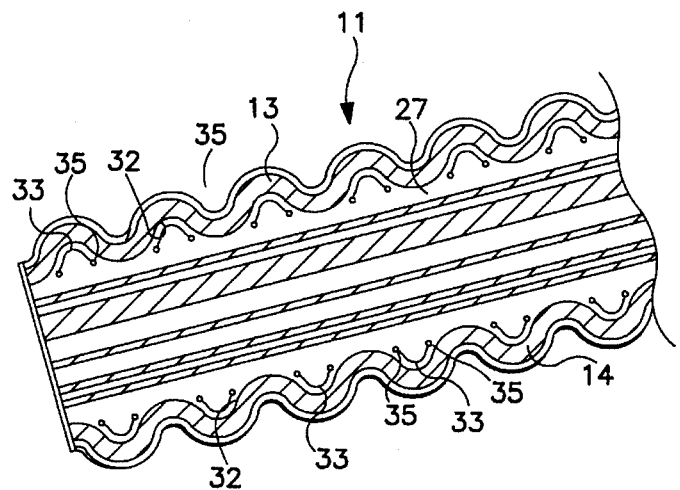
FIG. 3 is a perspective view, showing a variant of a flat circuit unit of the same.

Furthermore, as shown in FIG. 3, the trough-side slits 33 in the flat cable 11 may be provided with small and round perforations 35 at both ends of the slits. In this way, any tearing liable to appear at the extremities of the trough-side slits can be prevented. In addition, the peak-side slits 31 in the other flat cable 12 may also be provided with such round and small perforations at both ends of the slits.

Although the aforementioned embodiment shows a structure in which each peak 30 and each trough 32 is equipped with a peak-side slit 31 and a trough-side slits 33, these may also be formed, for example, at every two peaks 30 and troughs 32 or at any other appropriate interval.

Figure 4:
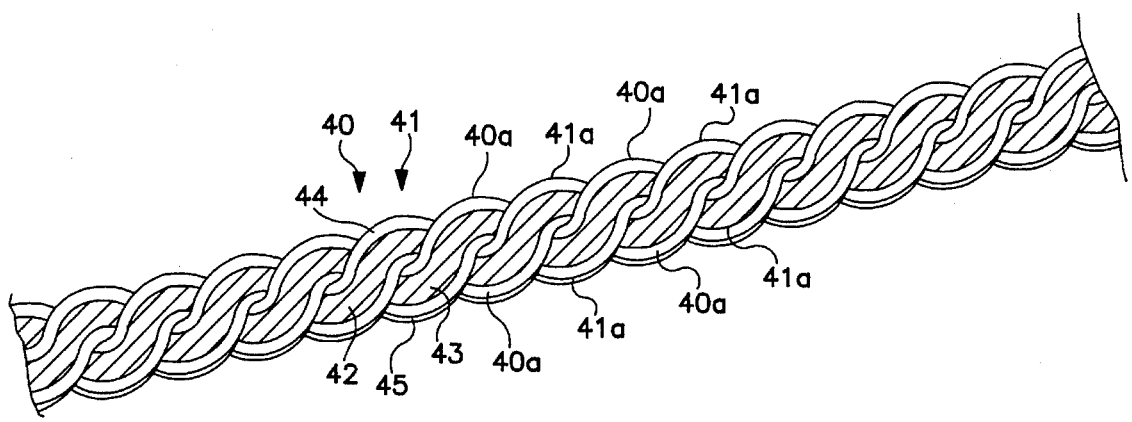
FIG. 4 is a perspective view, showing the second embodiment of the invention.

FIG. 4 shows another example of the invention in which a pair of flat cables 40, 41 as an example of flat circuit units are provided with flat circuit conductors 42, 43 as an example of circuit conductors, the flat conductors undulating to form wave-like patterns along thier respective Iogitudinal directions. In these examples, though not shown in the figures, each flat side of the flat conductor 42, 43 is coated with an insulation layer 44, 45 such as an insulation film or the like, so that said flat conductor is embedded in said insulation layer.

The insulation layer 44, 45 of each flat cable 40, 41 is a little wider than its corresponding flat conductor 42, 43 and undulates to form wave-like patterns along the flat conductor 42, 43.

As seen in FIG. 4, each wave 40a, 41a of each respective flat cable 40, 41 is interwoven in alternate upside and downside fashion. Accordingly, when viewed from a perpendicular direction with respect to the planes of both of the flat cables 40, 41, these flat cables are reciprocally fixed in such a way that the areas bounded by both of either flat conductors 42, 43 are formed between the two points where each undulating flat conductor 42, 43 intersects the other.

In such a case, because each wave 40a, 41a of both of either flat cables 40, 41 is interwoven in alternate upside and downside fashion, dislocations between the respective positions of the flat cables 40, 41 can be effectively prevented and fixing can be performed reliably. Furthermore, because of the flat cables 40, 41 themselves being interwoven for fixing, the present fixing means has the advantage of eliminating the need for any other fixing materials.

Figure 5:
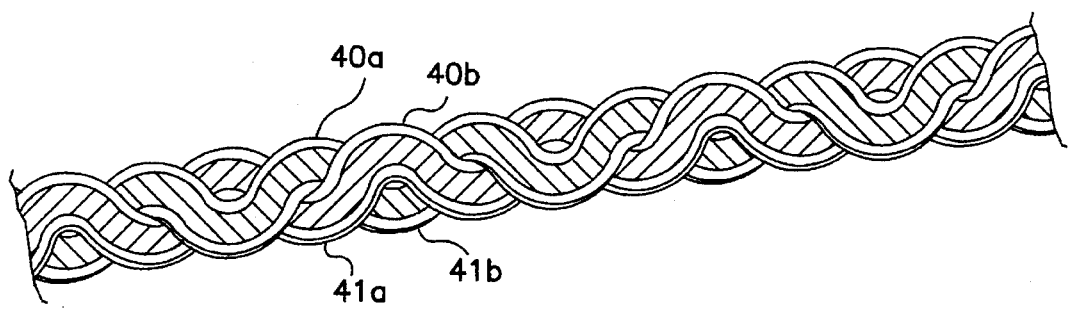
FIG. 5 is a variant of the second embodiment.
Figure 6:
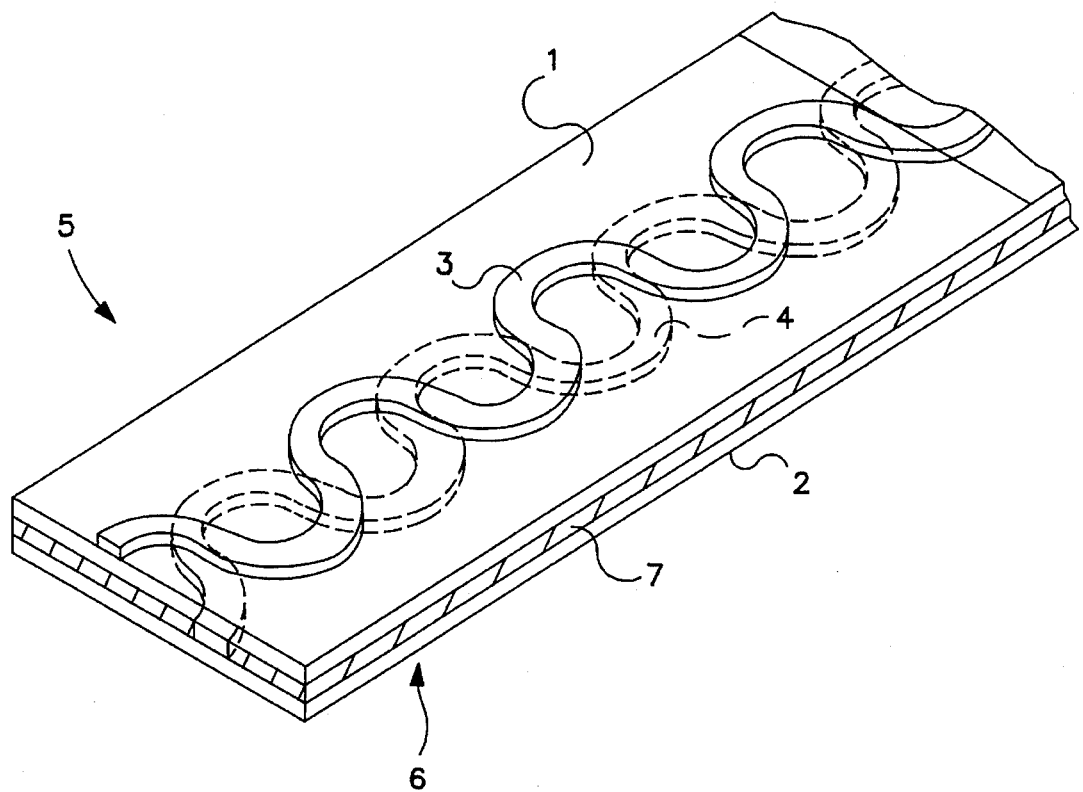
FIG. 6 is a perspective view, showing a pair of flat circuit units according to the prior art.

FIG. 5 shows an example of a variant of the invention in which interweaving is formed at a regular interval but not at every intersection of the two units. For example each wave of a flat cable of even rank is in an interweaving relationship with the corresponding wave of the other flat cable, and the waves of odd ranks of the flat cables are not in an interweaving relationship. In FIG. 5 waves 40a and 41a are interwoven but waves 40b and 41b are not interwoven.

As described above, according to the first embodiment of the invention relating to fixing means for flat circuit units, one of the flat circuit units is provided with circuit conductors undulating to form wave-like patterns, outside the peaks of which are formed peak-side slits along said peaks and preferably at regular intervals thereof. On the other hand, the other circuit unit is provided with circuit conductors undulating to form the wave-like patterns, inside the troughs of which are formed trough-side slits along said troughs and at positions corresponding to said peak-side slits. Subsequently, each tongue formed by each trough-side slit of said other flat circuit unit is inserted in each peak-side slit position of said one of the flat circuit units. Thus, a pair of flat circuit units are reciprocally fixed. This fixing means makes it possible not only to prevent effectively a dislocation between the respective positions of the flat circuit units but also to perform a reliable fixing. Furthermore, this fixing means has the advantage of eliminating the need for any other fixing materials.

According to the second embodiment of the invention relating to fixing means of flat circuit units, two flat circuit units are made to undulate to form wave-like patterns which are a little wider than the respective circuit conductors therein. Thus, waves of both of either flat circuit units, preferably each wave thereof, are interwoven in alternate upside and downside fashion. A pair of flat circuit units are reciprocally fixed. This fixing means makes it possible not only to prevent dislocations between the respective positions of the flat circuit units, but also to perform a reliable fixing. Furthermore, this fixing means has the advantage of eliminating the need for any other fixing materials.

I claim:

1. Process for fixing a pair of flat circuit units comprising the steps of:

preparing a pair of flat circuit units, each unit comprising an insulation layer and at least one circuit conductor therein or thereon, said circuit conductor undulating along the plane direction of said insulation layer and extending in its longitudinal direction, so as to form wave-like patterns along the plane, superposing fixedly said flat circuit units in a coplanar fashion, such that at least one insulation layer is interposed between the superposed conductors, and whereby each peak of one of undulating circuit conductor faces each trough of the other undulating circuit conductor and such that areas delimited by the respective circuit conductors are formed between the pairs of points where said circuit conductors intersect each other, and, fixing together the pair of flat circuit units by interweaving the peaks of the wave-like pattern of one of said undulating circuit conductor with corresponding troughs of the wave-like pattern of the other undulating circuit conductor, or vice versa.

2. Process according to claim 1, wherein the interweaving involves forming two circuit conductors in each of the flat circuit units; providing, for a first circuit unit, a plurality of peak-side slits through the insulation layer at positions inside and along the peaks of the two circuit conductors of said first circuit unit, as viewed from the longitudinal centre axis, and, for a second circuit unit, a plurality of trough-side slits through the insulation layer at positions, inside and along the troughs of the two circuit conductors of said second circuit unit, as viewed from said axis, the positions of said trough-side slits corresponding to those of said peak-side slits of said first circuit unit; and inserting each tongue formed by each trough-side slit of said second circuit unit in each peak-side slit of said first circuit unit.

3. Process according to claim 2, wherein the two circuit conductors in each of the flat circuit units are provided in the vicinity of each of the longitudinal edges of each unit.

4. Process according to claim 2, wherein the interweaving involves providing the plurality of peak-side slits at regular intervals.

5. Process according to claim 4, wherein the interweaving further involves providing slits for every peak-side.

6. Process according to claim 2, wherein at least one of either the peak-side slits or the trough-side slits is provided at both extremities of the slits, with perforations to prevent tearing.

7. Process according to claim 1, wherein each of the flat circuit units further comprises at least one linear circuit-conductors.

8. Process according to claim 1, wherein the means enabling interweaving is prepared by forming the insulation layers of both of the flat circuit units as an undulation to form wave-like patterns, in correspondence with those of their respective circuit conductors, the breadth of the wave-like patterns of the insulation layers being a little larger than that of the corresponding circuit conductor; and fixing the pair of flat circuit units reciprocally by interweaving peaks of one unit with corresponding troughs of the other unit, or vice versa, in alternate upside and downside fashion.

9. Process according to claim 8, wherein the interweaving is effected at every intersection of both units.

10. A pair of connected flat circuit units, each unit comprising an insulation layer and at least one circuit conductor therein or thereon, said circuit conductor undulating along the plane direction of said insulation layer and extending in the longitudinal direction thereof so as to form wave-like patterns along the plane, said flat circuit units being superposed fixedly in a coplanar fashion, such that at least one insulation layer is interposed between the superposed conductors, whereby each peak of one of the undulating circuit conductor faces each trough of the other undulating circuit conductor and such that areas delimited by the respective circuit conductors are formed between pairs of points where said circuit conductors intersect each other, the pair of flat circuit units being fixed with an interweaving between the peaks of the wave-like pattern of one of said undulating circuit conductors and corresponding troughs of the wave-like pattern of the other undulating circuit conductor, or vice versa.

11. A pair of connected flat circuit units according to claim 10, wherein the interweaving is formed by two circuit conductors in each of the flat circuit units; and, for a first circuit unit, a plurality of peak-side slits are formed through the insulation layer at positions inside and along the peaks of the two circuit conductors of said first circuit unit as viewed from the longitudinal centre axis; and, for a second circuit unit, a plurality of trough-side slits are formed through the insulation layer at positions inside and along the troughs of the two circuit conductors of said second circuit unit as viewed from said axis, the positions of said trough-side slits corresponding to those of said peak-side slits of said first circuit unit, and each tongue formed by each trough-side slit of said second circuit unit being inserted in each peak-side slit of said first circuit unit.

12. A pair of connected flat circuit units according to claim 11, wherein the two circuit conductors in each of the flat circuit units are provided in the vicinity of each of the longitudinal edges of each unit.

13. A pair of connected flat circuit units according to claim 11, wherein the plurality of peak-side slits are provided at regular intervals.

14. A pair of connected flat circuit units according to claim 13, wherein slits are provided for every peak-side.

15. A pair of connected flat circuit units according to claim 11, wherein at least one of either the peak-side slits or the trough-side slits is provided, at both extremities of the slits, with perforations to prevent tearing.

16. A pair of connected flat circuit units according to claim 10, wherein each of the flat circuit units further comprises at least one linear circuit conductor.

17. A pair of connected flat circuit units according to claim 10, wherein the insulation layers of both of the flat circuit units are respectively made into an undulation to form wave-like patterns in accordance with those of their corresponding circuit conductor, the breadth of the wave-like patterns of the insulation layers is a little larger than that of the corresponding circuit conductor and the pair of flat circuit units are fixed reciprocally so that peaks of one unit are interwoven with corresponding troughs of the other unit, or vice versa, in alternate upside and downside fashion.

18. A pair of connected flat circuit units according to claim 17, wherein the interweaving is provided at every intersection of both units.

* * * * *